United States Patent [19]

Briguet et al.

[11] Patent Number: 4,728,895

[45] Date of Patent: Mar. 1, 1988

[54] SYSTEM OF COILS FOR PRODUCING ADDITIONAL FIELDS FOR OBTAINING POLARIZATION FIELDS WITH CONSTANT GRADIENTS IN A MAGNET HAVING POLARIZATION POLE PIECES FOR IMAGE PRODUCTION BY NUCLEAR MAGNETIC RESONANCE

[75] Inventors: André Briguet, Villeurbanne; Christian Jeandey, Egreve; Edmond Tournier, Grenoble, all of France

[73] Assignee: Commissariat a l'Energie Atomique, Paris, France

[21] Appl. No.: 780,309

[22] Filed: Sep. 26, 1985

[30] Foreign Application Priority Data

Oct. 5, 1984 [FR] France .................. 84 15301

[51] Int. Cl.$^4$ .............................................. G01R 33/20
[52] U.S. Cl. ................................... 324/318; 324/309; 335/299
[58] Field of Search ............... 324/318, 319, 320, 307, 324/309, 300; 335/299, 296, 297; 336/189, 190, 191, 200, 231

[56] References Cited

U.S. PATENT DOCUMENTS

| 3,199,021 | 8/1965 | Anderson | 324/320 |
| 3,515,979 | 2/1970 | Golay | 324/320 |
| 3,569,823 | 5/1971 | Golay | 324/320 |
| 4,015,196 | 3/1977 | Moore et al. | 324/309 |
| 4,106,106 | 8/1978 | Wolfshagen et al. | 365/2 |
| 4,187,485 | 2/1980 | Wollnik | 335/299 |
| 4,209,848 | 6/1980 | Braun et al. | 365/2 |
| 4,318,043 | 3/1982 | Crooks et al. | 324/309 |

FOREIGN PATENT DOCUMENTS 0086560 8/1983 European Pat. Off. .

Primary Examiner—Stewart J. Levy
Assistant Examiner—Scott M. Oldham
Attorney, Agent, or Firm—Oblon, Fisher, Spivak, McClelland & Maier

[57] ABSTRACT

System of coils for producing additional fields in a magnet having pole pieces for producing images by nuclear magnetic resonance. For producing gradients $Gx=(\partial Bz/\partial x)$ and $Gy=(\partial Bz/\partial y)$, it comprises two layers of orthogonal windings, one on each pole piece. For producing the gradient $Gz=(\partial Bz/\partial z)$, it has two systems of windings of circular symmetry and axis Oz, located on the inner facing faces of the pole pieces and traversed by currents whose direction changes between the individual pole pieces.

10 Claims, 9 Drawing Figures

SYSTEM OF COILS FOR PRODUCING ADDITIONAL FIELDS FOR OBTAINING POLARIZATION FIELDS WITH CONSTANT GRADIENTS IN A MAGNET HAVING POLARIZATION POLE PIECES FOR IMAGE PRODUCTION BY NUCLEAR MAGNETIC RESONANCE

BACKGROUND OF THE INVENTION

The present invention relates to image production by nuclear magnetic resonance (NMR), which is at present undergoing rapid development, particularly for the examination of the human body, whereof it makes it possible to obtain images or pictures with a quality and precision unknown hitherto with conventional X-ray radiology methods.

The NMR image production method uses the property of nuclear magnetic resonance of certain nuclei present in the human body, essentially the protons distributed throughout the organism and several nuclei which are of biological interest and present in much larger numbers, such as phosphorus ($^{31}p$), potassium ($^{39}k$) and sodium ($^{23}Na$).

A medical NMR installation essentially comprises a magnet for producing throughout the zone of the body to be examined a static, uniform polarization magnetic field Bo, on which is superimposed with the aid of an auxilliary coil a radio-frequency rotary field in a plane perpendicular to the direction of the preceeding field $\vec{Bo}$.

The images are obtained by resonating the hydrogen nuclei or protons contained in the biological tissues. This resonance is possible because each proton behaves like a microscopic magnet. Thus, on applying the static field $\vec{Bo}$, the spins are all oriented parallel to the field axis. Thus, they only have two possible orientations, in the direction of the field or in the opposite direction. Nothing happens when the rotary field is applied at a random frequency. However, if this frequency is chosen equal to or very close to $f_o$, such that $2\pi f_o = \gamma B_o$, in which $\gamma$ is a physical constant characteristic of the nuclei which it is wished to resonate and called the gyromagnetic ratio, the coupling of the spins and the rotary field reaches a value such that the latter resonate.

The detected resonant signal is proportional to the magnetization of the nuclei placed in the magnetic polarization field Bo. The observation of the resonance phenomenon consequently requires the presence of a high magnetic field (0.1 to 1 Tesla) with a very high uniformity throughout the volume to be imaged.

The actual magnetic resonance image, which constitutes the medical objective of the patient scan, is then progressively constructed by spatial coding with the aid of a computer. For the purpose, several known methods exist, particularly the construction of the image by points, by lines and by planes and there is no need to give details thereof here. For the understanding of the present text, it is merely necessary to know that they all involve the sperimposing in time succession on the polarization field Bo.of a large number of complementary fields having very short durations and amplitudes, which are variable in three directions (x, y and z) in space in order to produce with $\vec{Bo}$, a resultant field $\vec{B}$, whose component $\vec{Bz}$ has spatial gradients $\partial Bz/\partial x$, $\partial Bz/\partial y$ and $\partial Bz/\partial z$, which are constant along x, y and z, z being the direction of the field Bo. The associated electronics and antennae for the reception of the various resonant signals of the protons have a sufficiently wide path band to receive the resonant frequency f, close to $f_o$, corresponding at each point examined to the value $2\pi f = \gamma B$, B being the modulus of the resultant field at this point, by definition close to $\vec{Bo}$.

For information purposes, field $\vec{Bo}$ has a value of 0.1 to 1 Tesla and the gradients $\partial Bz/\partial x$, $\partial Bz/\partial y$ and $\partial Bz/\partial z$ have an order of magnitude of $10^{-1}$ to $10^{-2}$ Tesla/meter over an average length ± approximately 20 cm. Also for information purposes, roughly 6 minutes are required by this method to construct a section of $128 \times 128$ points, which corresponds to the establishment of 128 different coding gradients. Modern machines make it possible to obtain several sections simultaneously (4 to 6).

The magnet used for producing the polarization magnetic field Bo can be, as a function of the particular case, either an electromagnet with or without a magnetic circuit, or a permanent magnet, each of the solutions having specific advantages and disadvantages.

In the case of an electromagnet, the latter usually comprises simple helical coils in air, with no magnetic circuit, whereof the diameter of the winding is made sufficient to surround the cranium of the patient or his body and all the necessary accessories (antennae, gradient coils, etc). These coils then produce a polarization field $\vec{Bo}$, which passes through the patient from his feet to his head in the axis of his body.

In the case of a permanent magnet, the presence of a magnetic coil makes it necessary to place the patient in a tunnel defined by the magnet casing and the polarization induction $\vec{Bo}$ then generally passes through the patient's body from the chest to the back in a sagittal direction.

The present invention specifically relates to the field of devices for producing linear magnetic field gradients in permanent magnets or electromagnets, having a high permeability pole pieces and more particularly applies, although this is not limitative, to permanent magnets of the type forming the subject matter of the French Patent Application No. 2562785 published on Oct. 18, 1985 and whose structure will be referred to hereinafter. Thus, the invention applies to the case where the patient placed in the air gap between an upper pole piece and a lower pole piece is traversed by the polarization field in a sagittal direction identified in axis Oz.

The devices for producing magnetic fields with constant gradients constitute a very important part of an image production device for display and condition its structure because:

(1) the quality of the gradients is dependent on the quality of the image, any variation in the gradient leading to the distortion thereof;

(2) the devices, generally coils, must be positioned as close as possible to the object to be imaged in accordance with imperative linearity conditions (to within 1% throughout the colume to be imaged), in order to limit the magnet air gap and consequently the weight and therefore the cost of the machine, this being in spatial configurations such that they permit the passage of the patient in said air gap;

(3) the method for producing the constant gradient fields must be integrated in an optimum manner in the structure of the magnetic circuit (in the present case in the pole pieces) to limit the power of the pulsating current supplies, which can reach several dozen kW in existing displays (resistive and cryomagnets);

(4) the constant gradient fields must be established for each measurement in relatively short times, less than a few ms.

For NMR image production systems with resistive or superconductor magnets constituted by coils, whereof the field lines re-close in air, for producing complementary fields producing constant spatial gradients, correction coils are used, designed for correcting in a general manner the non-uniformities of the polarization field up to the fourth order, order by order, with a set of coils for each order and the gradients are likened to corrections of the first order.

All these systems are based on the fact that any physically realisable magnetic field can develop in accordance with a basis of orthogonal functions, usually Legendre spherical harmonics. This process makes it possible to profile the field to different orders, the gradient being an approximation of the field of the first order. The advantage of this method is that, in theory, the different parameters of settings associated with a certain order (e.g. an electric current in a set of coils) do not interact and the checking of the field can be carried out in a progressive, although tedious manner, up to very high orders.

These devices are more particularly described in the article "Magnet field profiling: Analysis and correcting coil design" published in "Magnetic Resonance in Medicine", 1, 44–65, 1984. They are constituted by coils mounted on cylinders surrounding the patient and, on wishing to apply this procedure to permanent magnets, it will be necessary to place the coils in the air gap, relatively remotely from the pole pieces, which would lead to an unacceptable reduction in the amount of space reserved in said air gap for the patient's body.

For NMR image production systems with permanent magnets, at present the means used by the designers for producing the linear field gradients are not known, because the designers have maintained secrecy regarding the structures used.

A description will now be given of a known permanent magnet structure to which the present invention can be particularly advantageously applied and which forms the object of the unpublished French Patent Application EN No. 84 05903 of Apr. 13 1984 in the name of the present applicant. This known structure is shown in FIG. 1.

In FIG. 1, which is a perspective front view, there is a permanent magnet system having an upper pole piece 1 and a lower pole piece 2 with a generally rectangular parallelepipedic shape made from a ferromagnetic material with a very high permeability. The structure is laterally completed by two magnetizing blocks 3, 4, which also have a rectangular parallelepipedic shape and which are made from magnetized materials forming the seat of the magnetomotive force for producing the field in the tunnel-shaped air gap 5, specifically defined by the pole pieces 1, 2 and the magnetized blocks 3 and 4. The latter blocks are generally constituted by the juxtapositioning of columns, each constituted by a stack of elementary magnetic bricks such as 3a, 3b, 3c, etc, 4a, 4b, 4c, etc, which are thus also used as spacers and for maintaining the pole pieces 1 and 2 in place. These columns are not necessarily contiguous. The tunnel-shaped air gap 5 intended for optionally receiving all or part of a human body 6, is provided for this purpose with a minimum width and height of approximately 500 mm.

In FIG. 1, arrows show the distribution of the magnetic flux and the field lines in the magnetized blocks 3, 4, as well as in the pole pieces 1 and 2. As indicated in FIG. 1, the magnetic polarization induction Bo in tunnel 5 is directed vertically from top to bottom, i.e. from pole piece 1 to pole piece 2, thus traversing the patient's body 6 in a sagittal direction, 1dentified throughout the remainder of the present text by the setting axis Oz of the reference trihedron Ox, y, z of FIG. 1.

In this configuration, the gradients of component Bz along Oz of the different resulting fields necessary for contructing the image by spatial coding, namely $\partial Bz/\partial x$, $\partial Bz/\partial y$ and $\partial Bz/\partial y$ must be constant and satisfy the three following equations:

$$Bz(x) = \frac{\partial Bz}{\partial x} \cdot x = Gx \cdot x$$

$$Bz(y) = \frac{\partial Bz}{\partial y} \cdot y = Gy \cdot y$$

$$Bz(z) = \frac{\partial Bz}{\partial z} \cdot z = Gz \cdot z$$

in which Bz is the component of the resultant induction along the previously defined axis Oz and Gx, Gy, Gz are three constant gradients of the resultant induction in the three directions Ox, Oy and Oz.

SUMMARY OF THE INVENTION

The present invention specifically relates to a system of coils, adaptable to the preceeding structure, as well as to any type of magnet having high permeability, floating pole pieces and producing fields with constant gradients to within ±1% in the volumes to be imaged.

This system of coils for producing additional fields in a magnet having pole pieces for image production by nuclear magnetic resonance in a configuration where the polarization field $\overline{Bo}$, perpendicular to the pole pieces, is parallel to the direction Oz of a trirectangular reference trihedron, and the rectangular pole pieces have their sides parallel to the directions Ox and Oy of said same trihedron, for obtaining resultant polarization fields $\overline{B}$, whereof the component $\overline{Bz}$ in the direction Oz has constant gradients Gx, Gy, Gz in three directions in space, is characterized in that it comprises for producing the gradients $Gx = \partial Bz/x$ and $Gy = \partial Bz/\partial y$, two layers of orthogonal windings in series, one on each pole piece, each being constituted by conductors parallel to one of the axes Ox or Oy and which are uniformly distributed, being supplied in such a way that the currents flow in the same direction on the inner faces of the air gap and for producing the gradient $Gz = \partial Bz/\partial z$, two systems of circular symmetry windings of axis Oz, located on the inner facing faces of the pole pieces and tra ersed by currents in the opposite directions between the individual pole pieces.

According to the invention, the windings for producing the gradients $G_x$ and $G_y$ can be in two different forms. In a first form, the current "returns" are located on the opposite face of the "outward" conductors and each pole piece is consequently to a certain extent "swathed" by the conductors which pass through its two faces. In a second form, only the "outward" conductors are located on the surface of the pole pieces, the "return" conductors being located in a zone of the space remote from the pole pieces.

In a NMR image production system in which the magnet is a permanent magnet provided with pole pieces, it is known that it is not possible to use the same coils for producing the polarization field $\vec{B_0}$ and the additional fields superimposed on said field $\vec{B_0}$ for carrying out the spatial construction of the image. The invention consequently proposes a particularly simple system of coils making it possible to produce, with a linearity to within 1%, such additional fields leading to constant gradients. In the structure of this system of coils according to the invention, all the coils are located on the pole pieces without any loss of space for the patient, who has to be housed in the tunnel constituted by the magnetic circuit of the magnet.

Moreover, the current necessary for producing the additional constant gradient fields are substantially equal to half the current intensities necessary for producing the same additional fields in the prior art systems, where the polarization field producing coils are usually in air.

According to the invention, the system of windings of axis Oz consists of two symmetrical coils located on the pole pieces and each designed in such a way that the current intensity passing through a pane traversing axis Oz, between the centre of the coil and a point spaced by r from said axis, is proportional to $r^2$.

More specifically, when the system of windings of axis Ox comprises two coils constituted by concentric circular turns, the preceeding condition is translated by the fact that the spatial distribution of these turns as a function of the radius increases so that the total sum of the turns within a circle of radius r is proportional to $r^2$.

According to a particularly simple embodiment of the present system of coils, the turns thereof are distributed in groups located at distances r, 2r, 3r, etc from axis Oz, the number of turns of the successive groups being equal to the terms of the sequence of uneven numbers 1, 3, 5, etc $(2n+1)$. Thus, it is known that the sum of the uneven numbers from 1 to $2n+1$ is equal to $(n+1)^2$, which is in accordance with the aforementioned characteristic for the group of coil turns.

In a variant of the invention, the winding system of axis Oz is realised with the aid of a spiral printed circuit, whereof the spacing between the bands narrows on moving away from the centre, so as to respect the current distribution law proportionally to $r^2$ in the radial direction.

According to another variant of this same system of coils, the system of windings of circular symmetry of axis Oz is constituted by discrete coils located on cross-sections of circular cones of apex 0, forming the centre of the air gap, of axis Oz and half-angles at the apex $\theta$.

In a first form of this variant, the two coils on each pole piece respectively have numbers of turns in the ratio approximately 1 to 8.66 and are located on the cones of half-angles at the apex close to $\theta_1=34°$ and $\theta_2=62°$.

In another form of said same variant, the three coils on each pole piece respectively have numbers of turns in ratios of approximately 1 to 3.89 and 31.85 and are located on the cones of half-angles at the apex close to $\theta_1=26°$, $\theta_2=47°$ and $\theta_3=69°$.

BRIEF DESCRIPTION OF THE DRAWINGS

The invention is described in greater detail hereinafter relative to non-limitative embodiments and with reference to the attached FIGS. 1 to 9, wherein show.

DETAILED DESCRIPTION OF THE PREFERRED EMBODIMENTS

Figure 1:
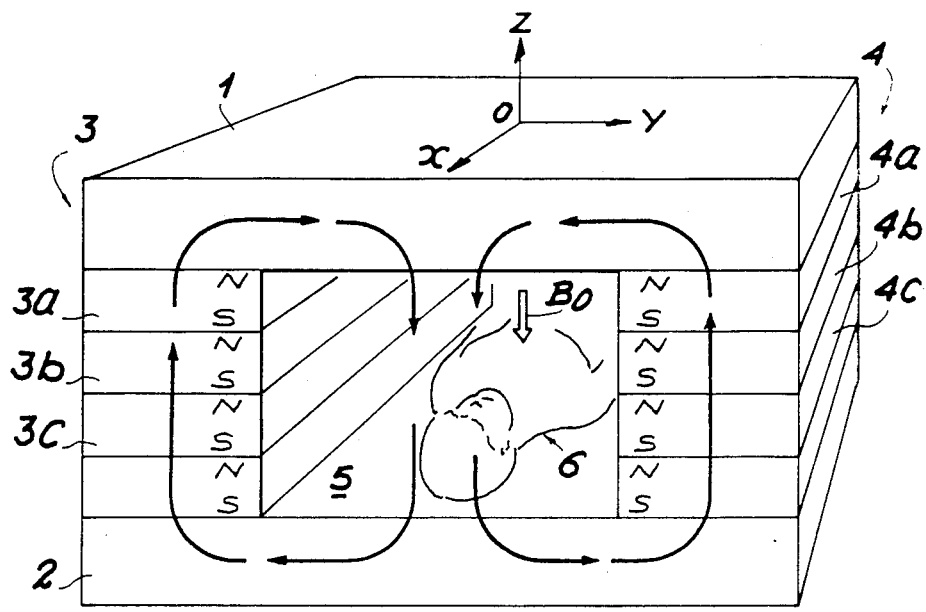
FIG. 1 is a perspective front view of a prior art apparatus.
Figure 2:
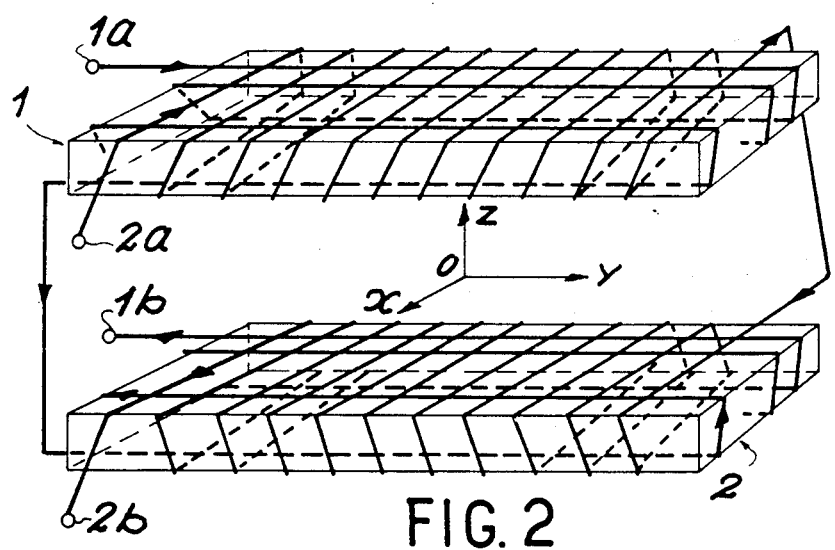
FIGS. 2 and 3 in cavalier and sectional perspective along an axis Oy, an embodiment of the gradients Gx and Gy.
Figure 3:
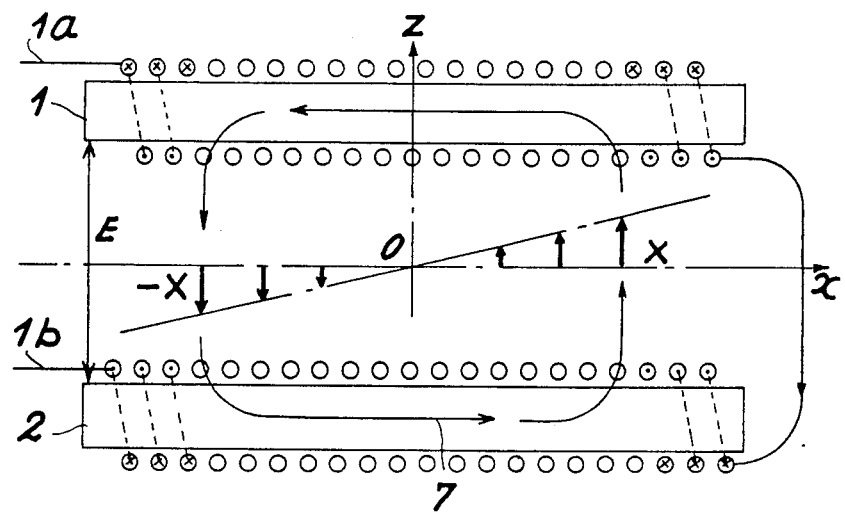

FIG. 2 diagrammatically shows in cavalier perspective form, the two pole pieces 1, 2 of the magnet of FIG. 1, on which are located the windings 1a, 1b for producing the gradient Gx and 2a, 2b for producing the gradient Gy. As can be seen therein, coils 1a and 1b on the one hand and 2a and 2b on the other are connected in series and surround the pole pieces 1, 2 of two current layers constituted by conductors parallel to directions Ox and Oy and uniformly distributed on the surface of the pole pieces 1, 2. Winding 2a, 2b, which is used for producing the gradient Gy is orthogonal to the first and is constituted in the same way by layers of parallel conductors uniformly distributed along axis Ox. According to the invention and as can be seen in FIG. 3 for coils 1a and 1b, the current directions are reversed between these coils, i.e. symmetrically with respect to the direction Ox for coils 1a, 1b and Oy for coils 2a, 2b. As can also be seen in FIGS. 2 and 3, the current return for each conductor is ensured by a parallel layer located on the other side of each pole piece and which consequently fulfills the function of a magnetic core immersed in a solenoid with a rectangular base. When the d.c. current is established in the aforementioned current layers, it produces linearly increasing magnetic potential in directions x or y in the pole pieces. This leads to fields of constant gradients in these directions and, on simultaneously applying the current to the two windings 1a, 1b on the one hand and 2a, 2b on the other, by state superimposing a directed field gradient is obtained in plane xOy.

In practical terms, the coils are produced either with an insulating wire encircling the pole pieces 1, 2, or by etching on a printed circuit, whereof the two planes are consequently joined by rigid connecting wires or bands. According to the invention, layers 1a, 1b on the one hand are traversed in series by the same intensity as the layers 2a, 2b on the other.

As pole pieces 1, 2 are long compared with the thickness of the air gap necessary for the uniformity of the field $\vec{B_0}$, this easily leads to constant gradients to within ±1% over roughly half of each of the pole pieces 1, 2. If it is wished to further increase the uniformity of the steady field $\vec{B_0}$, it is possible to improve the uniformity zone of the preceeding gradient by slightly modifying the spacing of the conductors of layers 1a, 2a and 1b, 2b, close to the ends of the pieces 4 and this amounts to the same, by superimposing a few supplementary ampere turns on the layers on the layers. This correction is of the same nature as that for the steady field $\vec{Bo}$, which is obtained in permanent magnets with the aid of guard ring systems.

An explanation will now be given with reference to FIG. 3 of the principle of operation of the systems of coils of FIG. 2, which is as follows. For this purpose, a calculation is made of the circulation of the field vector H along the closed loop 7 passing both through the air gap of size E and the superimposed pole pieces 1, 2 made from a material with a sufficiently high permeability ($\mu \geq 100$), that the magneto motor force necessary for the circulation of the field in these pole pieces can be assumed as zero. Under these conditions, on referring to the extreme abscissas of loop 7 as $+X$ and $-X$, Ampere's Law can then be written along said loop 7:

$$2Bz(X) \cdot E = 4\mu_o \int_0^X i_x dx \qquad (1)$$

in which E is the width of the air gap, $i_x$ the current line density at dimension x and expressed in $A.m^{-1}$ and $\mu_u$ being in the SI system $4\pi.10^{-7} A.s.V^{-1}.m^{-1}$.

As the condition to be satisfied for the gradient Gx is by definition $Bx(X) = Gx.X$, this means:

$$i = \frac{Gx \cdot E}{2\mu_0} = \text{constant} \qquad (2)$$

Equation 2 shows that the proportionality of component Bz(X) to abscissa X is automatically obtained by a constant current density i, whereof the value given is by equation 2.

This calculation makes it possible to prove that the structure of FIGS. 2 and 3 makes it possible, with the aid of the layer 1a, 1b of coils surrounding the pole pieces 1, 2, to produce in the air gap an additional field, whose gradient Gx is constant as soon as the coils of constant spacing are traversed in series by a current i.

Figure 4:
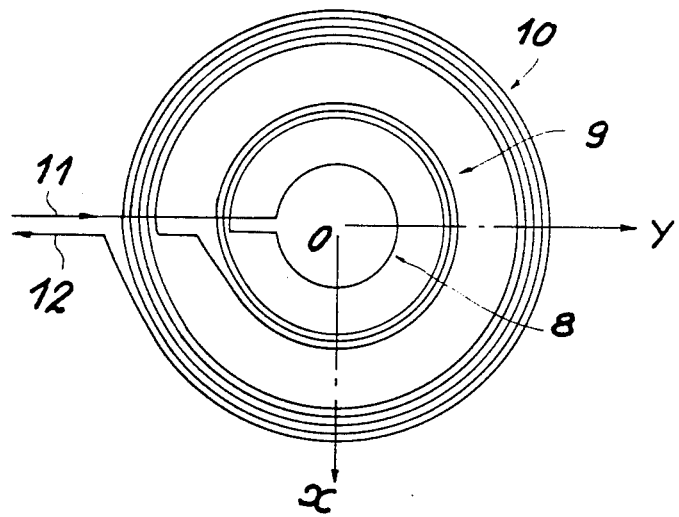
FIG. 4 a possible construction of a coil of axis Oz for producing the gradient Gz.

Relative to FIG. 4 will be described one of the possible embodiments of coils having a circular concentric structure centred on the axis Oz for producing gradient Gz. According to the invention, this coil has turns distributed in the following manner. At distance r from centre O is located a turn 8, at distance 2r from centre O there are three turns 9 and at distance 3r from centre O there are five turns 10. All these turns are obviously in series between input 11 and an output 12 and two assemblies like that of FIG. 4 face one another on the two pole pieces 1 and 2, each of them being traversed by the same intensity i circulating in the opposite direction to the circulation in the other coil. The number of groups of turns is not limitative. In practice, a spacing between each group is taken as approximately one centimeter.

Figure 5:
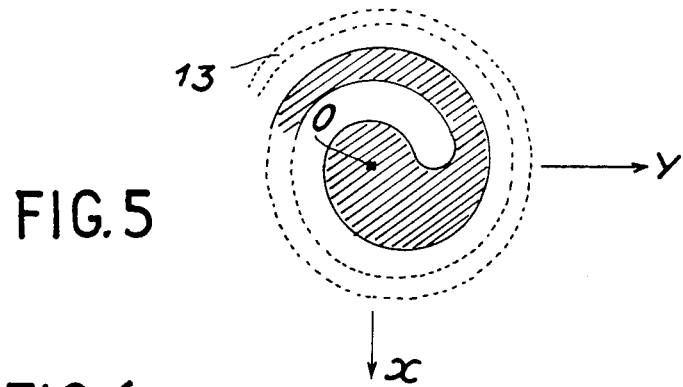
FIG. 5 a variant of the preceeding coil in a construction in the form of a printed cirucit.

FIG. 5 shows a coil for producing gradient Gz having around axis OZ, on the planar face of the pole piece turned towards the air gap, a spiral printed circuit 13, whereof the spacing between the different bands narrows on moving away from centre O, so that the current intensity circulating perpendicular to one of the planes xOz or yOz between centre O and a point with a spacing r is proportional to the square of the distance r at centre O.

Figure 6:
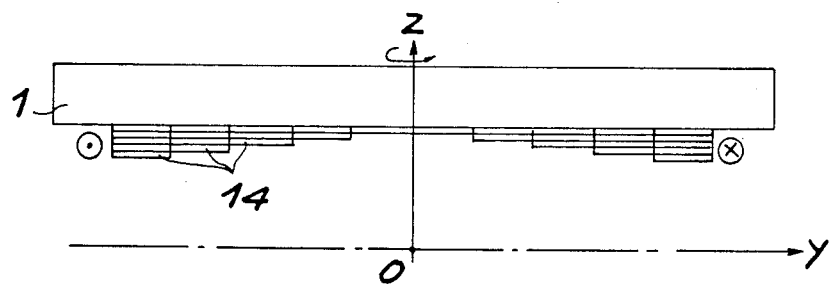
FIG. 6 another variant of a coil for producing a gradient Gz constituted by a stack of flat turns.

FIG. 6 shows a variant of the coil for producing radiant Gz, in which said coil has a certain number of flat turns, such as 14 assembled in accordance with concentric zones, whereof each has a width of one turn. Thus, a stack of conical profile in the plane of the drawing is obtained, which is the plane yOz of FIG. 1. Obviously, the thus stacked turns are insulated from one another, connected in series and traversed by currents whose directions marked in FIG. 6 are opposed on passing from the coil covering pole piece 1 to the coil covering pole piece 2. The distribution of the different elementary flat turns satisfies the condition according to which the number of turns in plane zOy from the centre up to the distance r from the axis Oz is proportional to $r^2$.

Figure 7:
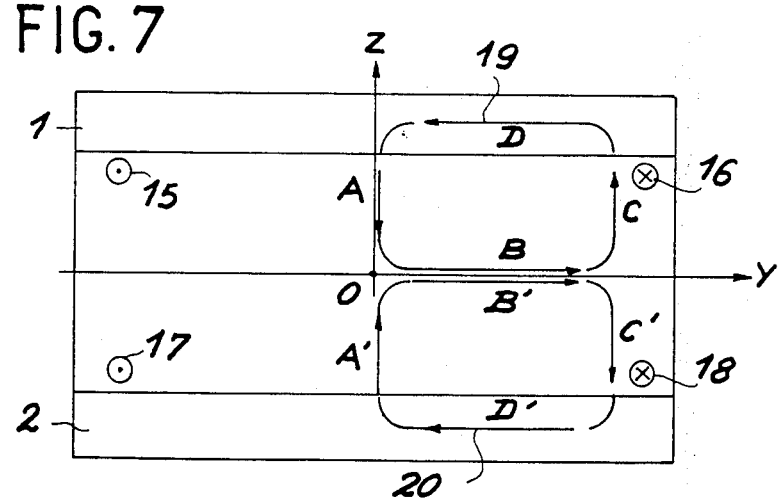
FIG. 7 a sectional view along plane yOz of the pole pieces of the permanent magnet making it possible to explain the operation of the aforementioned coils.

The operating principle of the coils of FIGS. 4, 5 and 6 will now described with reference to FIG. 7, in which it is possible to see the pole pieces 1, 2 in section along plane yOz. Two coils for producing the gradient Gz according to the invention are diagrammatically indicated by the upper conductors 15, 16 and lower conductors 17, 18.

On now considering a cylindrical volume of radius r centred on axis Oz and of thickness Dz at height z, the flux entering by the upper face of said volume is $Bz.S = Gz.(Z+dz).\pi R^2$, the flux leaving by the lower face of said volume is $Gz.(Z).\pi R^2$. The difference between these two fluxes must be equal to the flux escaping through the side walls, namely: $Gz.dz.\pi R^2 = Br.2\pi R.dz$ or:

$$r(R) = \frac{Gz \cdot R}{2} \qquad (3)$$

in which Br (R) is the radial induction at distance r from the centre.

On returning now to FIG. 7, consideration will be given to two closed paths 19, 20 leaving the pole pieces along axis Z (A and A') and then a common path in a median plane (B and B'), followed by two paths parallel to the axis Z entering the pole pieces (C and C') to close along two paths (D and D').

The circulation of the field is zero for parts D and D' in the pole pieces (permeability $\mu$rel $> 100$), it is opposed for portions A and C, as well as A' and C' (component Bz). All that is left is the circulation of Br along B and B', so that it is possible to write:

$$\int_0^R \frac{1}{2} Br \cdot dr = \mu_o \int_0^R ir \cdot dr$$

in which ir is the line current density in coils 15-16 and 17-18, namely $$ir = \frac{1}{2\mu_0} Br.$$

Thus, by comparison with equation 3, we obtain:

$$ir(R) = \frac{Gz \cdot R}{4\mu_0} \qquad (4)$$

Equation 4 means that for producing gradients Gz it is sufficient to line the facing faces of the pole pieces with circular current layers centred on axis Z and whose line density $i_r$ increases linearly as r. This condition leads to the obtaining of concentric coils, whereof the number of turns increases in such a way that the total sum of the inner turns in a circle of radius r is proportional to the square of the distance r at the centre.

A description will now be given with reference to FIGS. 8 and 9 of two types of special coil, still of axis Oz, for producing gradients Gz, but in the form of discrete coils, whose position and number of turns are determined by nomographs and calculations resulting from the Legendre polynomial theory.

FIG. 8 once again diagrammatically shows the pole pieces 1,2 against which are placed four coils 21, 22, 23 and 24, which are respectively located at the intersection of the pole faces and circular cones of axis Oz, whose apex is located at zero and of half-angles at the apex of aperture $\theta_4 = 34°$ and $\theta_2 = 62°$. The ratio of the number of turns between coils 21, 22 or 23, 24 is as close as possible to 1 to 8.66 and the directions of the currents, indicated diagrammatically in FIG. 8 by conventional symbols, are reversed from one pole piece to the next, as in the remainder of the invention.

Figure 8:
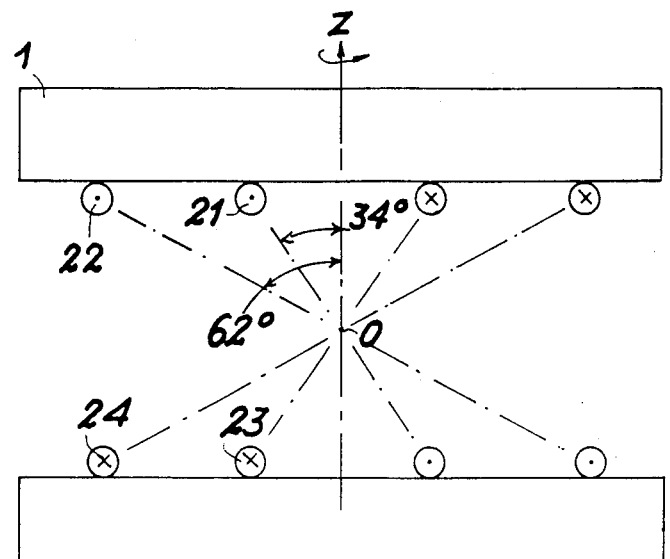
FIG. 8 an example of an embodiment of the coils for producing gradient Gz with the aid of two discrete coils located beneath the pole pieces.
Figure 9:
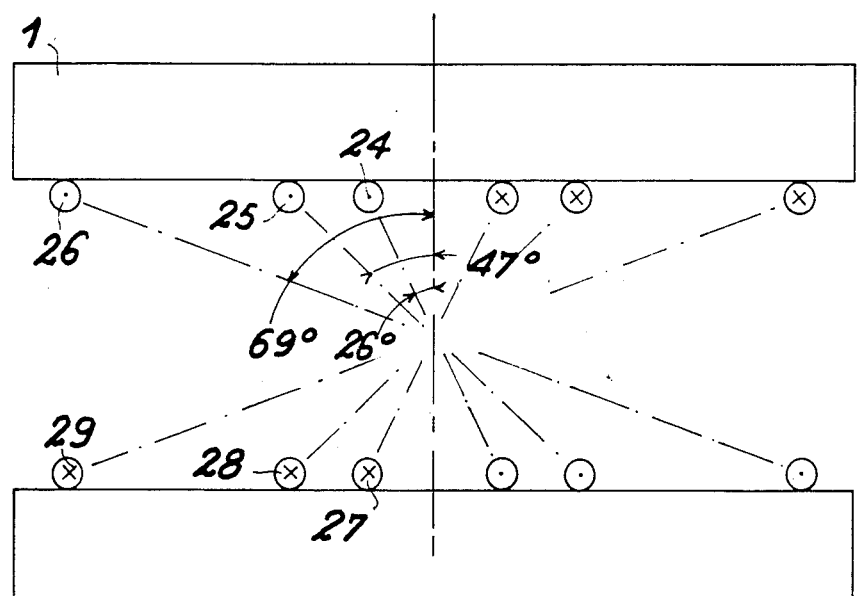
FIG. 9 an embodiment with three discrete coils for producing the same gradient Gz.

FIG. 9 shows a structure of the same type as in FIG. 8, but having on each pole piece three instead of two coils. They are respectively designated 24, 25 and 26 for pole piece 1 and 27, 28 and 29 for pole piece 2. According to the invention, these coils are located at the intersection of pole pieces 1 and 2 with the cylindrical cones of revolution of axis Oz and half-angles at the respective apices of 26° for the first cone, 47° for the second and 69° for the third. The ratios of the number of turns in each of the coils r, in the centre of the periphery, approximately 1 to 3.89 and 31.85. As hereinbefore, the current directions shown on the coils are reversed on passing from pole piece 1 to pole piece 2.

As can be seen in all the embodiments described, the coil systems according to the invention are all positioned against the faces of the facing pole pieces of the polarization magnet and consequently lead to substantially no space loss in the air gap, which has to house the patient to be examined.

What is claimed is:

1. A system of coils for producing additional fields in a magnet having pole pieces for image production by nuclear magnetic resonance in a configuration where the polarization field $\overline{Bo}$, perpendicular to the pole pieces, is parallel to the direction Oz of a trirectangular reference trihedron, and the rectangular or circular pole pieces have their faces parallel to the directions Ox and Oy of said same trihedron and are separated by an air gap, for obtaining resultant polarization fields $\overline{B}$, whose component $\overline{Bz}$ in direction Oz has constant gradients Gx, Gy and Gz in three directions in space, said coil system comprises for producing gradients $Gx = (\partial Bz/\partial z)$ and $Gy = (\partial Bz/\partial y)$, two orthogonal winding layers, one on each pole piece, each being constituted by conductors parallel to one of the axes Ox or Oy and uniformly distributed, while being supplied in such a way that the currents flow in the same direction on the faces of the pole pieces facing the air gap, said currents returning on the opposite face of the pole pieces and for producing the gradient $Gz = (\partial Bz/\partial z)$, there are two winding systems having circular symmetry with axis Oz, located on the inner facing faces of the pole pieces and traversed by currents having opposite directions in the individual pole pieces.

2. A system of coils for producing additional fields in a magnet having pole pieces for image production by nuclear magnetic resonance in a configuration where the polarization field $\overline{Bo}$, perpendicular to the pole pieces, is parallel to the direction Oz of a trirectangular reference trihedron, and the rectangular or circular pole pieces have their faces parallel to the directions Ox and Oy of said same trihedron and are separated by an air gap, for obtaining resultant polarization fields $\overline{B}$, whose component $\overline{Bz}$ in direction Oz has constant gradients Gx, Gy and Gz in three directions in space, said coil system comprises for producing gradients $Gz = (\partial Bz/\partial z)$ and $Gy = (\partial Bz/\partial y)$, two orthogonal winding layers, one on each pole piece, each being constituted by conductors parallel to one of the axes Ox or Oy and uniformly distributed, while being supplied in such a way that the currents flow in the same direction on the faces of the pole pieces facing the air gap wherein the windings for producing the gradients Gx and Gy have their conductors carrying current in one direction located on the face opposite to the conductors carrying current in the opposite direction, each pole piece then to a certain extent being "swathed" by the conductors passing along its two faces and for producing the gradient $Gz = (\partial Bz/\partial z)$, there are two winding systems having circular symmetry with axis Oz, located on the inner facing faces of the pole pieces and traversed by currents having opposite directions in the individual pole pieces.

3. A system of coils according to claim 2, wherein said winding systems of axis Oz comprises two symmetrical coils located on the pole pieces and each designed in such a way that the current intensity passing through a plane passing through the axis Oz between the coil centre and a point spaced by r from said axis is proportional to $r^2$.

4. A system of coils according to claim 3, said symmetrical coils further comprising circular concentric turns, whose spatial distribution increases as a function of the radius, in such a way that the total sum of the turns within a circle of radius r is proportional to $r^2$.

5. A system of coils according to claim 4, wherein the turns are distributed in groups located at distances r, 2r, 3r, etc. from axis Oz, the number of turns of successive groups being equal to the terms of the sequence of uneven numbers 1, 3, 7, etc, $(2n+1)$.

6. A system of coils according to claim 3, wherein said winding systems are obtained with the aid of a spiral printed circuit, whereof the spacing between the conductive surfaces of the printed circuit narrows on moving away from the centre, so as to respect the current distribution law proportionally to $r^2$ in accordance with the radial direction.

7. A system of coils according to claim 4, wherein said winding systems are obtained by a stack of flat contiguous turns in series in accordance with a conical profile, in a plane passing through Oz and respecting the law of the number of turns proportional to $r^2$ in a circle of radius r.

8. A system of turns according to claim 2, wherein said winding systems are constituted by discrete coils, located on the cross-sections of circular cones of apex 0, the centre of the air gap, of axis Oz and half-angles $\theta$ at the apex.

9. A system of coils according to claim 8, wherein the two coils on each pole piece respectively have numbers of turns in the ratio approximately 1 to 8.66 and are located on cones of half-angles at the apex close to $\theta_1 = 34°$ and $\theta_2 = 62°$.

10. A system of coils according to claim 8, wherein the three coils on each pole piece respectively have numbers of turns in ratios of approximately 1 to 3.89 and 31.85 and located on cones of half-angles at the apex close to $\theta_1 = 26°$, $\theta_2 = 47°$ and $\theta_3 = 69°$.

* * * * *